(12) United States Patent
Shishido et al.

(10) Patent No.: US 8,819,893 B2
(45) Date of Patent: Sep. 2, 2014

(54) CABLE BUSHING

(71) Applicant: Asahi Denshi Co., Ltd., Fukushima (JP)

(72) Inventors: Tetsuo Shishido, Fukushima (JP);
Kimihiro Nara, Fukushima (JP);
Yasuhiro Makuta, Fukushima (JP)

(73) Assignee: Asahi Denshi Co., Ltd., Fukushima (JP)

( * ) Notice: Subject to any disclaimer, the term of this patent is extended or adjusted under 35 U.S.C. 154(b) by 0 days.

(21) Appl. No.: 13/818,216

(22) PCT Filed: Oct. 26, 2012

(86) PCT No.: PCT/JP2012/077735
§ 371 (c)(1),
(2), (4) Date: Feb. 21, 2013

(87) PCT Pub. No.: WO2013/065598
PCT Pub. Date: May 10, 2013

(65) Prior Publication Data
US 2014/0115822 A1    May 1, 2014

(51) Int. Cl.
*F16L 5/02* (2006.01)
*H05K 7/00* (2006.01)
*H05K 5/06* (2006.01)
*H02G 3/22* (2006.01)

(52) U.S. Cl.
CPC .. *H02G 3/22* (2013.01); *H05K 7/00* (2013.01); *F16L 5/02* (2013.01); *H05K 5/069* (2013.01)
USPC ............................ 16/2.2; 439/465; 174/656

(58) Field of Classification Search
CPC .......... F16L 5/00; F16L 5/12; B60R 16/0222; H02G 3/083; H02G 3/22; H01R 13/5812

USPC .......... 16/2.1, 2, 2.5; 174/650, 652–656, 668; 439/449, 460, 465
See application file for complete search history.

(56) References Cited

U.S. PATENT DOCUMENTS 2,986,409 A * 5/1961 Weber ..................... 285/154.3
3,567,843 A * 3/1971 Collins et al. ............... 174/51
(Continued)

FOREIGN PATENT DOCUMENTS

JP     50-139281 U    11/1975
JP     1-176982 U     12/1989
(Continued)

*Primary Examiner* — William Miller
(74) *Attorney, Agent, or Firm* — Carrier Blackman & Associates, P.C.; Joseph P. Carrier; William D. Blackman

(57) ABSTRACT

In a cable bushing capable reliably prevent slip-off while also making assembly easy, a cutout and a raised section are formed so as to regulate the turning of a base member and the interlocking section of a cable holding member. A base ridge is formed on the outer circumferential surface of the base member, and a cap ridge is formed on the inner circumferential surface of the back end of the cap member, enabling the cap member to be rotationally pushed onto the base member. In order to regulate the turning of the cable holding member and the cap member as well as prevent the cap member from slipping off the cable holding member, an engaging section is formed on the cable holding member, and an engaging receiver engaged by the engaging section in the turning direction and the front-to-back direction is formed on the cap member.

6 Claims, 4 Drawing Sheets

(56) References Cited

U.S. PATENT DOCUMENTS

| | | | |
|---|---|---|---|
| 4,022,966 A * | 5/1977 | Gajajiva | 174/653 |
| 4,481,697 A * | 11/1984 | Bachle | 24/135 R |
| 4,549,755 A * | 10/1985 | Kot et al. | 285/341 |
| 5,021,610 A * | 6/1991 | Roberts | 174/652 |
| 5,059,747 A * | 10/1991 | Bawa et al. | 174/655 |
| 5,208,427 A * | 5/1993 | Couto et al. | 174/653 |
| 5,678,866 A * | 10/1997 | Mina | 174/153 A |
| 6,133,529 A * | 10/2000 | Gretz | 174/656 |
| 6,616,194 B1 * | 9/2003 | Gretz | 285/151.1 |
| 6,737,584 B2 * | 5/2004 | Kiely | 174/656 |
| 7,635,816 B1 * | 12/2009 | Shemtov | 174/650 |
| 8,129,633 B1 * | 3/2012 | Shemtov | 174/652 |
| 2012/0329311 A1 * | 12/2012 | Duval et al. | 439/449 |

FOREIGN PATENT DOCUMENTS

| | | |
|---|---|---|
| JP | 3047605 U | 1/1998 |
| JP | 2001-021066 A | 1/2001 |
| JP | 2002-340235 A | 11/2002 |
| JP | 2012-089640 A | 5/2012 |

* cited by examiner

CABLE BUSHING

TECHNICAL FIELD

The present invention relates to a cable bushing enabling insertion of a cable into a housing.

BACKGROUND ART

In the related art, a known cable bushing of this type is equipped with a tubular cable lead tube projecting out from a housing, a seal member inserted into the cable lead tube with a cable in an inserted state, and a bush that covers the opening of the cable lead tube in a state where the seal member is inserted into the cable lead tube, in which an engaging hole is formed on the cable lead tube, while in addition, an engaging projection that engages with the engaging hole is formed on the outer circumferential surface of the bush (see PTL 1, pg. 8 line 6 to pg. 9 line 3, and FIG. 1, cited below).

CITATION LIST

Patent Literature

PTL 1: Japanese Unexamined Utility Model (Registration) Application Publication No. H1-176982

SUMMARY OF INVENTION

Technical Problem

However, with a cable bushing of the related art, aligning the engaging hole of the cable lead tube with the engaging projection of the bush is cumbersome. Namely, in order to make the engaging hole and the engaging projection engage with each other, it is necessary to first conduct alignment in rotational direction by rotating the bush with respect to the cable lead tube, and in addition, push the bush into the cable lead tube and align its position in the front-to-back direction.

For this reason, in cases of insufficient alignment of the bush in the rotational direction with respect to the cable lead tube, there is a risk that the engaging hole and the engaging projection will not engage and the bush and cable will slip off, no matter how far the bush is pushed in to align its position in the front-to-back direction.

Furthermore, even in cases where alignment of the bush in the rotational direction with respect to the cable lead tube is conducted correctly, there is still a risk that the engaging hole and the engaging projection will not engage and the bush and cable will slip off in cases where the bush is insufficiently pushed in.

In light of the above circumstances, the present invention takes as an object to provide a cable bushing making it possible to reliably prevent slip-off while also making assembly easy.

Solution to Problem

A cable bushing enabling insertion of a cable in accordance with a first aspect of the present invention includes a housing provided with an insertion hole through which the cable is inserted, a tubular base member projecting from an outer wall of the housing, concentrically with the insertion hole, a cable holding member having a tubular shape that contacts and holds the cable at its inner circumferential surface, and also having, on its outer circumferential surface at the back end, an interlocking section that interlocks with the inner circumferential surface of the base member, and a cap member installed so as to cover the outer circumferential surface of the base member and the cable holding member while in a state where the interlocking section of the cable holding member is interlocked with the inner circumferential surface of the base member. A turning regulator is formed to one or both of the base member and the interlocking section so as to regulate the turning of the base member and the interlocking section of the cable holding member, a rotational pushing-in mechanism is formed between the outer circumferential surface of the base member and the inner circumferential surface of the back end of the cap member, and at least one engaging section is formed on the cable holding member, while in addition, at least one engaging receiver engaged by the engaging section in the turning direction and the front-to-back direction is formed on the cap member.

According to such a cable bushing in accordance with a first aspect of the present invention, turning of the base member and the cable holding member is regulated by a turning regulator, and thus the cable holding member is fixed to the base member by making the interlocking section of the cable holding member interlock with the inner circumferential surface of the base member.

By pushing the cap member into the base member while rotating the same, the cap member is tightened onto the base member by a rotational pushing-in mechanism between the outer circumferential surface of the base member and the inner circumferential surface on the back end of the cap member.

Then, when the cap member is tightened onto the base member, the engaging sections of the cable holding member engage with the engaging receivers of the cap member, regulating movement in the turning direction and the front-to-back direction.

In this way, by configuring the engaging sections of the cable holding member to engage with the engaging receivers of the cap member by turning the cap member with respect to the base member, it is possible to make it unnecessary to align the cap member with respect to the base member in the rotational direction and the front-to-back direction.

Furthermore, by simultaneously regulating the turning direction and the front-to-back direction with the engagement of the engaging sections of the cable holding member and the engaging receivers of the cap member, it is possible to make a reliable engagement between the engaging sections of the cable holding member and the engaging receivers of the cap member, and it is possible to reliably prevent the cap member and the cable from slipping off from the housing.

In this way, according to a cable bushing in accordance with a first aspect of the present invention, it is possible to reliably prevent slip-off while making assembly easy.

A cable bushing in accordance with a second aspect of the present invention is configured such that, in the first aspect of the present invention, a first indicator indicating a rotation reference position is formed on the outer circumferential surface of the interlocking section of the cable holding member, a second indicator indicating a rotation reference position is formed on the outer circumferential surface of the cap member, and the engaging receiver is formed at a position which is engaged by the engaging section by mating the second indicator with the first indicator and turning the cap member by a fixed angle with respect to the cable holding member.

According to such a cable bushing in accordance with a second aspect of the present invention, while a worker assembling the cable bushing may conduct the assembly work smoothly by making supplementary use of rotational direction of reference positions for each member if such exist, by specifying with the first indicator and the second indicator the rotational start position of a minimum rotational angle required in order to tighten the cap member onto the base member and make the engaging section engage with the engaging receiver, it is possible to make the engaging section engage with the engaging receiver by turning the cap member by a constant angle given as the minimum rotational angle, starting from the rotational start position.

Meanwhile, even if the worker is unconscious about the rotational start position for the cap member with respect to the cable holding member, the cap member will eventually be tightened onto the base member and the engaging section will engage with the engaging receiver by turning the cap member with respect to the cable holding member (although the angle becomes greater than the above minimum rotational angle).

In this way, according to the cable bushing in accordance with the second aspect of the present invention, it is possible to reduce the worker burden in either case and reliably prevent slip-off while making assembly easy.

A cable bushing in accordance with a third aspect of the present invention is configured such that, in the second aspect of the present invention, a cutout is formed on the base member, and a raised section which interlock with the cutout and which act as the first indicator is formed on the outer circumferential surface of the interlocking section of the cable holding member, with the cutout and the raised section being provided as the turning regulator, and the fixed angle is 90 degrees, and the rotational pushing-in mechanism is formed over a span of at least 90 degrees in a rotational direction starting from the cutout on one or both of the outer circumferential surface of the base member and the inner circumferential surface of the back end of the cap member.

According to a cable bushing in accordance with the third aspect of the present invention, the cutout is provided on the base member to regulate turning with respect to the cable holding member, while in addition, the cutout is taken to be the rotational start position of the rotational pushing-in mechanism. In so doing, it is possible to tighten the cap member onto the base member and cause the engaging section to engage with the engaging receiver due to the rotational pushing-in mechanism by simply turning the cap member 90 degrees starting from that position.

Meanwhile, even if the worker is unconscious about the position for the cap member with respect to the cable holding member, the cap member will be loosened with respect to the base member until reaching the rotational start position of the rotational pushing-in mechanism, and will eventually reach the rotational start position of the rotational pushing-in mechanism and be tightened onto the base member, and the engaging section will engage with the engaging receiver.

In this way, according to the cable bushing in accordance with the third aspect of the present invention, it is possible to further reduce the worker burden in either case and reliably prevent slip-off while making assembly easy.

A cable bushing in accordance with a fourth aspect of the present invention is configured such that, in any of the first through third aspects of the present invention, the cable holding member is equipped with a support section giving cantilevered support to the engaging section, and a cable slippage stopper given cantilevered support in the opposite direction of the engaging section from the support section and which projects to an inner circumferential surface side.

According to such a cable bushing in accordance with a fourth aspect of the present invention, if the cap member is pushed in by the rotational pushing-in mechanism with respect to the base member, the inner circumferential surface of the cap member will contact the outer circumferential surface of the cable slippage stopper, and the cable slippage stoppers given cantilevered support from the support section will move towards the inner circumferential surface side. For this reason, the inwardly projecting cable slippage stopper will bite and hold the cable.

In addition, in the case where the engaging section is biased outward from the support section and engage with the engaging receiver formed on the inner surface of the cap member, the support section become seesaw, such that when the engaging section engages with the engaging receiver, the cable slippage stopper on the opposite side with the support section in the center moves farther towards the inner circumferential surface side and more firmly hold the cable.

In this way, according to the cable bushing in accordance with the fourth aspect of the present invention, it is possible to prevent the cable from slipping during the process of installing the cap member, and it is possible to reduce the worker burden and reliably prevent slip-off while making assembly easy.

A cable bushing in accordance with a fifth aspect of the present invention is configured such that, in any of the first through fourth aspects of the present invention, the cable holding member is symmetrically bisected left and right about a dividing line in the lengthwise direction.

According to such a cable bushing in accordance with the fifth aspect of the present invention, while passing the cable through the cable holding member is cumbersome because the cable holding member contacts and holds the cable against its inner surface, by configuring the cable holding member to be symmetrically bisected left and right about a dividing line in the lengthwise direction, it is possible to unite the bisected cable holding member at a desired position and hold the cable, without passing the cable through the cable holding member.

In this way, according to the cable bushing in accordance with the fifth aspect of the present invention, it is possible to reduce the worker burden and reliably prevent slip-off while making assembly easy.

A cable bushing in accordance with a sixth aspect of the present invention is configured such that, in any of the first to fifth aspects of the present invention, in the cable holding member, the outer circumferential surface of the interlocking section has a large bore at the front end, and a seal member is installed at the inner circumferential surface of the interlocking section.

According to such a cable bushing in accordance with the sixth aspect of the present invention, by installing a seal member at the inner circumferential surface of the interlocking section, it is possible to prevent the seepage of rainwater into the housing, even in the case of outdoor installation.

In this way, according to the cable bushing in accordance with the sixth aspect of the present invention, it is possible to reliably prevent slip-off while making assembly easy, and while also preventing the seepage of liquids into the housing.

DESCRIPTION OF EMBODIMENTS

Figure 1:
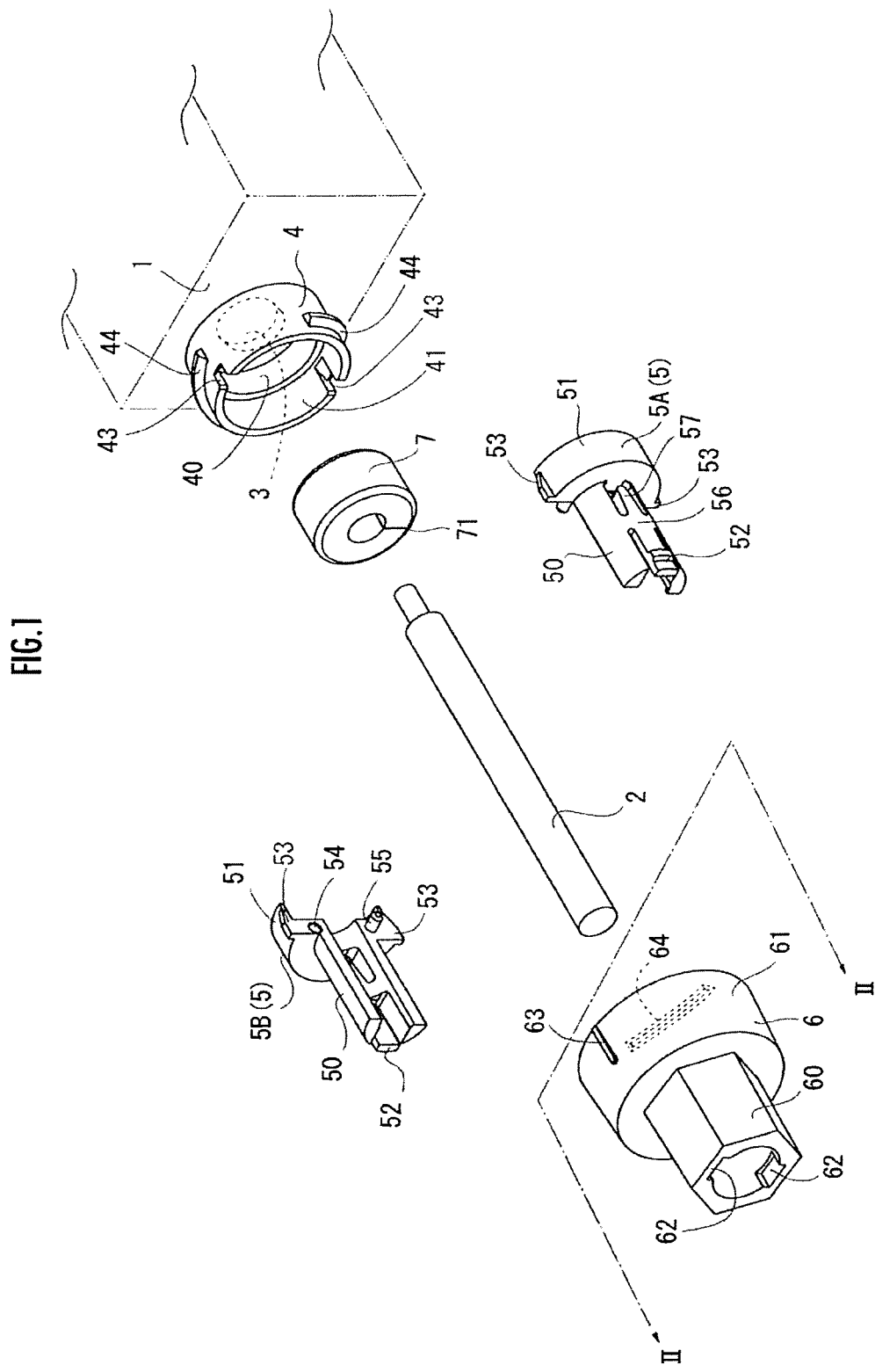
FIG. 1 is an exploded view illustrating a cable bushing according to an embodiment of the present invention.

As illustrated in FIG. 1, a cable bushing of the present embodiment is a bushing enabling insertion of a cable 2 into a housing 1, and is equipped with an insertion hole 3, a base member 4, a cable holding member 5, a cap member 6, and a seal member 7.

The housing 1 is a plastic casing in which electronic components or an electronic board with electronic components installed thereon are stored.

The cable 2 is a cable electrically connected to an electronic component or electronic board inside the housing 1, and is connected to an external device via the cable bushing.

The insertion hole 3 is a hole provided in the wall of the housing 1, through which the cable 2 is inserted. The insertion hole 3 has a diameter that is larger than the outer diameter of the cable 2, such that the cable 2 is inserted without making contact.

The base member 4 has a tubular body projecting out from an outer wall of the housing 1, concentrically with the insertion hole 3.

The inner surface of the base member 4 forms a large-bore section 41 at its front end side towards the opening, with respect to a small-bore section 40 at its back end side. Additionally, a pair of cutouts 43, 43 are formed by cutting out each opposing positions on the edge of the large-bore section 41.

Also, base ridges 44, 44 are formed on the outer circumferential surface of the base member 4, being helically formed over a span of 90 degrees counter-clockwise in the rotational direction, starting from the pair of cutouts 43, 43.

The cable holding member 5 has a tubular shape uniting two divided members 5A and 5B discussed later, and is equipped with a holding member body 50 that contacts and holds the cable 2 with its inner circumferential surface, and an interlocking section 51 that interlocks with the large-bore section 41 of the base member 4 at the back end of the holding member body 50.

Outwardly projecting, claw-shaped engaging sections 52, 52 are formed at opposing positions at the front end of the holding member body 50.

Specifically, the engaging section 52 is provided on the tip of movable tab formed by cutting away a part of the tip of the holding member body 50 in the lengthwise direction. The movable tab provided with the engaging section 52 is given cantilevered support by a support section 56 such that the tip is movable to the outer peripheral surface side. In addition, similar movable tab partially cut out from the holding member body 50 is formed on the opposite side of the engaging section 52 with the support section 56 in the center, and a cable slippage stopper 57 is provided on such movable tab which projects towards the inner circumferential surface side. For this reason, the cable slippage stopper 57 likewise is given cantilevered support by the support section 56 such that the tip is movable to the inner peripheral surface side.

The interlocking section 51 has a larger bore than the holding member body 50 such that its outer circumferential surface interlocks with the large-bore section 41 of the base member 4. Additionally, a pair of raised sections 53 and 53 (corresponding to a first indicator of the present invention) are formed at opposing positions on the outer circumferential surface of the interlocking section 51.

The pair of raised sections 53, 53 respectively interlock with the pair of cutouts 43, 43 to form a turning regulator. For this reason, rotation of the cable holding member 5 with respect to the base member 4 is regulated when the interlocking section 51 interlocks with the large-bore section 41.

Note that in order to make a reliable interlock between the pair of raised sections 53 and 53 and the pair of cutouts 43 and 43, it is preferable to make it possible to visually or audibly confirm that the cable holding member 5 has been sufficiently pushed into the base member 4. For example, it is preferable to provide an engaging section that engages according to the front-to-back direction (the pushing-in direction) between the raised section 53 and the cutout 43, such that an engaging sound is produced when the cable holding member 5 is sufficiently pushed into the base member 4.

The inner circumferential surface of the interlocking section 51 also has a larger bore than the holding member body 50 that contacts and holds the cable 2, such that the outer circumferential surface of the interlocking section 51 becomes flush with the inner circumferential surface of the small-bore section 40 when in an interlocked state with the large-bore section 41.

Herein, the cable holding member 5 is symmetrically bisected left and right about a dividing line in the lengthwise direction (front-to-back direction) joining the pair of raised sections 53, 53, thus forming two divided members 5A and 5B. The divided members 5A and 5B have exactly the same shape, and it is possible to assemble any two thereof, irrespective of type.

Specifically, the divided members 5A and 5B have divided tabs at either edge which are obtained by bisecting each of the raised sections 53 themselves, and also include a respective engaging section 52. Also, a hole 54 and a projection 55 that interlocks during assembly are respectively formed on the divided faces of the divided members 5A and 5B.

Note that although the divided members 5A and 5B are two separated members in the drawings, a connecting tab that connects the divided members 5A and 5B to each other on one edge may be provided, making assembly easy by the connecting tab.

The cap member 6 is a member installed so as to cover the outer circumferential surface of the base member 4 and the cable holding member 5 in the state where the interlocking section 51 of the cable holding member 5 is interlocked with the inner circumferential surface of the base member 4, and is equipped with a cap body 60 into which the holding member body 50 of the cable holding member 5 is inserted, and a large-bore cap section 61 installed onto the outer circumferential surface of the base member 4.

In the cap body 60, engaging receivers 62, 62 that engage with the engaging sections 52, 52 of the holding member body 50 are formed at the tip of an insertion hole into which the holding member body 50 is inserted. The engaging receiver 62 is rectangular depression that, when engaged with the engaging section 52, regulates movement of the cap member 6 with respect to the cable holding member 5 in the turning direction and the front-to-back direction. Note that, in the drawings, movement is regulated in the front-to-back direction only for the direction of the cap member 6 slipping off the cable holding member 5, but motion in the pushing-in direction may also be regulated.

Indicator lines 63 and 63 (corresponding to a second indicator of the present invention) are provided at positions corresponding to the engaging receivers 62, 62 on the outer circumferential surface of the large-bore cap section 61 in the rotational direction.

Figure 2:
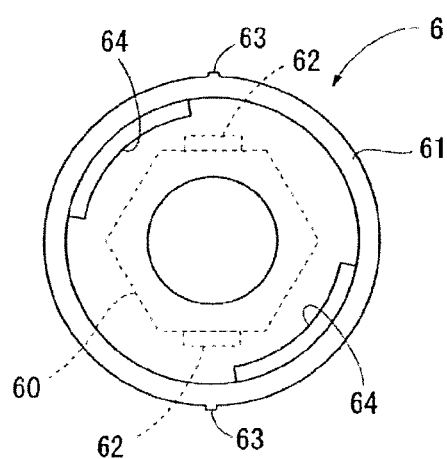
FIG. 2 is an explanatory diagram illustrating the cable bushing in FIG. 1 viewed from direction II.

Helically formed cap ridges 64 (see FIG. 2) are formed on the inner circumferential surface of the large-bore cap section 61 so as to thread with the base ridges 44 on the outer circumferential surface of the base member 4. The cap ridges 64 are formed over a span of 90 degrees clockwise in the rotational direction, starting from positions corresponding to the indicator lines 63. Note that the base ridges 44 and the cap ridges 64 constitute a rotational pushing-in mechanism of the present invention.

The seal member 7 is a flexible plastic material such as urethane, for example, and has a thick circular tube shape. The inner diameter of the seal member 7 has a shape corresponding to the outer diameter of the cable 2, while its outer diameter has a shape corresponding to the inner diameters of the large-bore section 41 of the base member 4 and the interlocking section 51 of the cable holding member 5. In addition, the width of the seal member 7 (the width in the front-to-back direction) corresponds to the sum of the width of the inner circumferential surface of the large-bore section 41 of the base member 4 (the width in the front-to-back direction) and the width of the inner circumferential surface of the interlocking section 51 of the cable holding member 5 (the width in the front-to-back direction).

Namely, the seal member 7 has a shape that is slightly larger than the corresponding spatial dimensions, such that the seal member 7 is compressively deformed by constriction of the cap member 6 with respect to the base member 4 and takes on a shape corresponding to the respective members.

Also, a slit 71 is formed at a radial position on the seal member 7. Via the slit 71, the seal member 7 is freely attachable and removable with respect to the cable 2 (without inserting the cable 2 therethrough).

The foregoing thus describes a configuration of the cable bushing according to the present embodiment.

Next, an assembly method of a cable bushing according to the present embodiment will be described with reference to FIGS. 1 to 5.

First, in FIG. 1, the worker performing assembly work attaches the seal member 7 to the cable 2. Attaching the seal member 7 to the cable 2 involves pulling the ends of the slit 71 away from each other to create a gap, and installing the cable 2 onto the inner circumferential surface of the seal member 7 through the gap.

Since the installation position of the seal member 7 on the cable 2 becomes a fixed position along the cable 2 in the corresponding cable bushing, the worker adjusts the installation position by sliding the seal member 7 along the cable 2 as necessary.

Next, the worker moves the cable 2 and seal member 7 towards the housing 1 and causes the seal member 7 to interlock with the large-bore section 41 of the base member 4.

At this point, in the case where the end of the cable 2 on the side of the housing 1 is connected and fixed to an electronic component or an electronic component inside the housing 1, the seal member 7 is slid along the cable 2, and the seal member 7 is made to interlock with the small-bore section 40 of the base member 4.

Next, the worker interposes the cable 2 between the two divided members 5A and 5B constituting the bisected cable holding member 5, and causes the holes 54 and the projections 55 of the divided members 5A and 5B to interlock. The cable holding member 5 is then slid along the cable 2, and the interlocking section 51 of the cable holding member 5 is made to interlock with the large-bore section 41 of the base member 4.

At this point, in order to make a reliable interlock, the pair of raised sections 53, 53 on the cable holding member 5 are mated to the pair of cutouts 43, 43 on the base member 4, causing the interlocking section 51 of the cable holding member 5 to interlock with the large-bore section 41 of the base member 4, and in so doing, an engaging sound is produced between the raised sections 53 and the cutouts 43.

Next, the worker installs the cap member 6 so as to cover the base member 4 and the cable holding member 5.

At this point, the worker first inserts the cable through the cap body 60 of the cap member 6, and outwardly inserts the large-bore cap section 61 of the cap member 6 to the base member 4 while mating the indicator line 63 of the large-bore cap section 61 with the cutout 43 of the base member 4 and the raised section 53 of the cable holding member 5.

By matching the indicator line 63 of the cap member 6 to the cutout 43 (raised section 53) in this way, it is possible to put the cap ridge 64 of the cap member 6 and the base ridge 44 of the base member 4 into a threading start position.

From this state, the cap ridge 64 of the cap member 6 and the base ridge 44 of the base member 4 are threaded together by turning the cap member 6 clockwise with respect to the base member 4.

At this point, the cap member 6 and the cable holding member 5 are arranged such that as the cap ridge 64 and the base ridge 44 become threaded together, the holding member body 50 of the cable holding member 5 advances into the insertion hole of the cap member 6.

Figure 3:
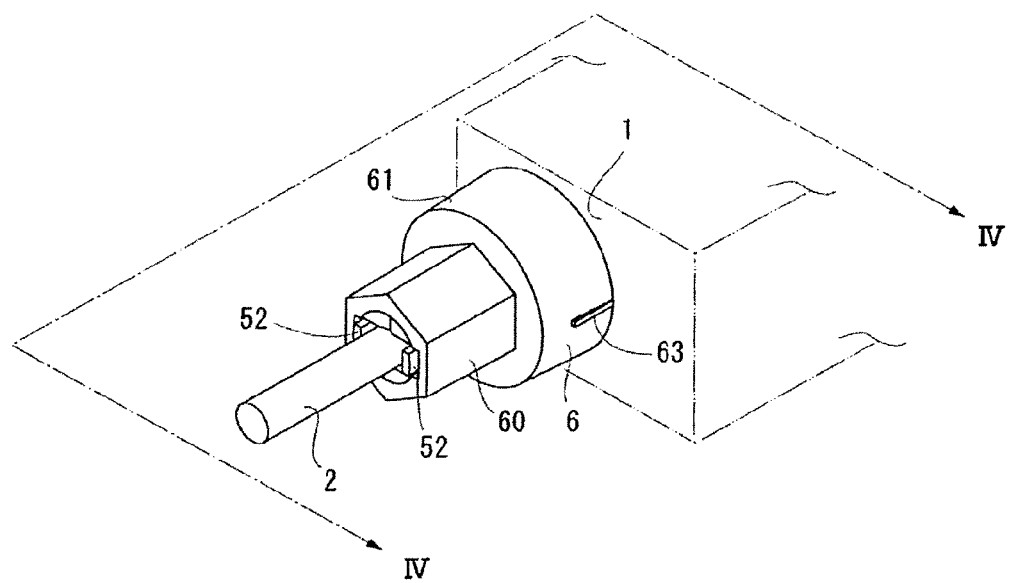
FIG. 3 is a perspective view illustrating the cable bushing in FIG. 1 in an assembled state.
Figure 4:
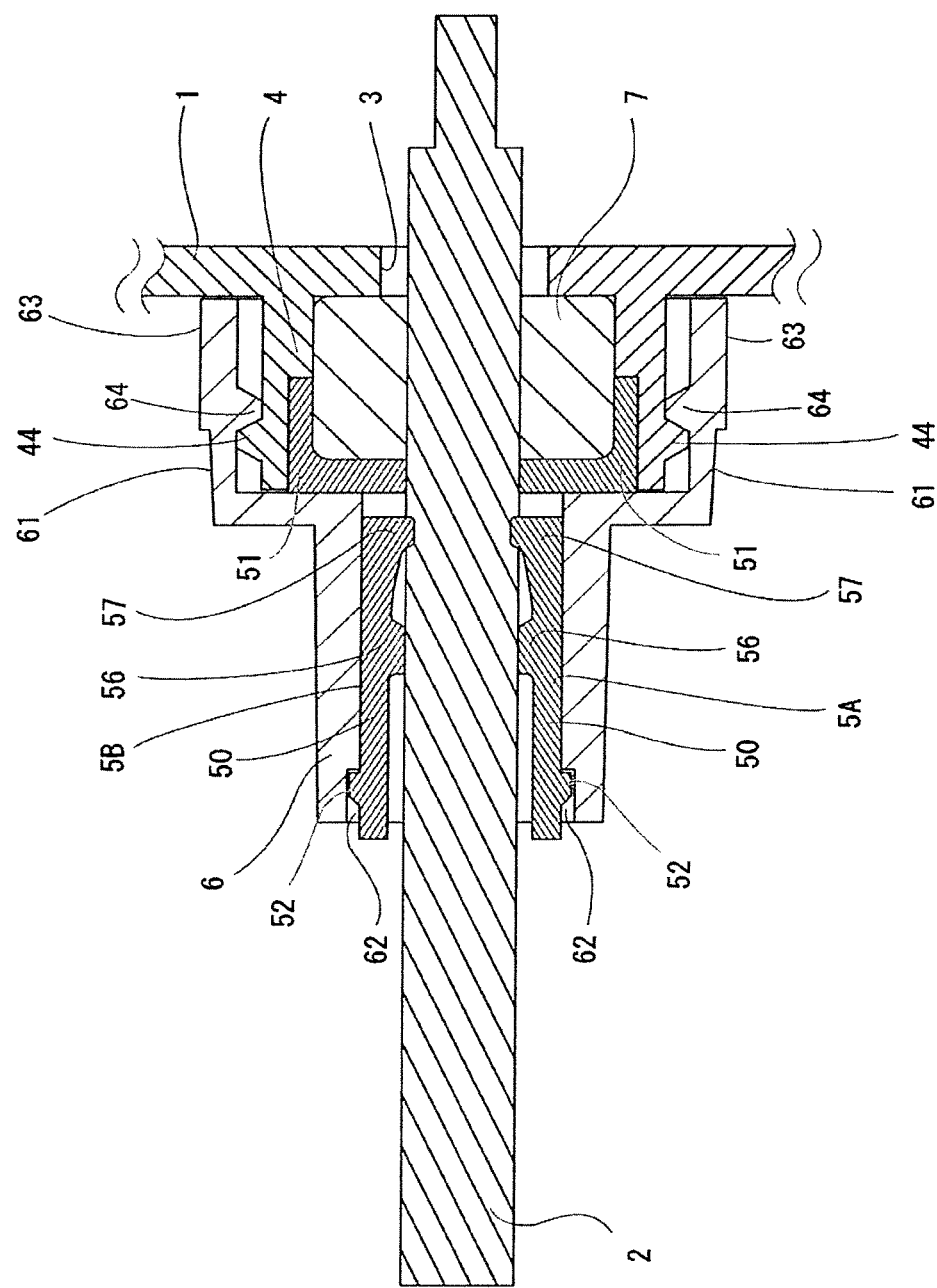
FIG. 4 is a cross-section view illustrating the cable bushing in FIG. 3, taken along the line IV.

Then, if the cap member 6 is turned 90 degrees clockwise with respect to the base member 4, the engaging sections 52, 52 of the holding member body 50 engage with the engaging receivers 62, 62 of the cap member 6, as illustrated in FIGS. 3 and 4.

Thus, movement of the cap member 6 with respect to the cable holding member 5 is regulated in the turning direction and the front-to-back direction. More accurately, with regard to the front-to-back direction, rotation of the cap member 6 with respect to the cable holding member 5 in the tightening and loosening directions is regulated by the engagement of the engaging sections 52, 52 with the engaging receivers 62, 62, and with respect to the pushing-in direction, regulated by the threading of the cap ridge 64 and the base ridge 44.

Figure 5A:
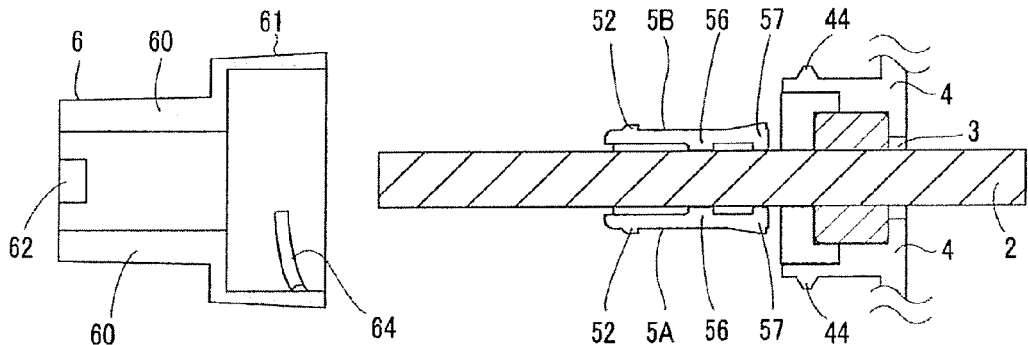
FIG. 5A is an explanatory diagram view illustrating a state before the installation of a cap member during assembly of the cable bushing in FIG. 1.
Figure 5B:
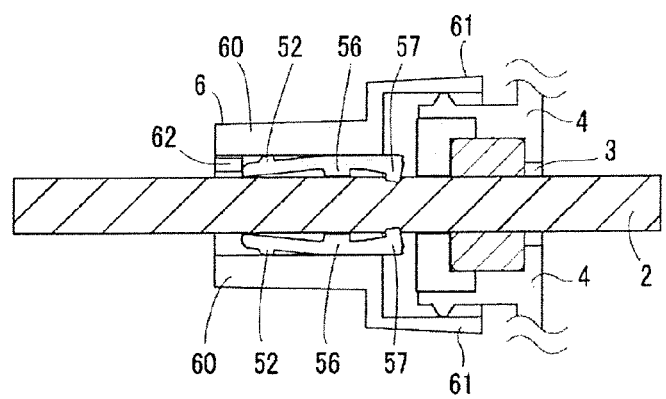
FIG. 5B is an explanatory diagram view illustrating a state during the installation of a cap member during assembly of the cable bushing in FIG. 1.
Figure 5C:
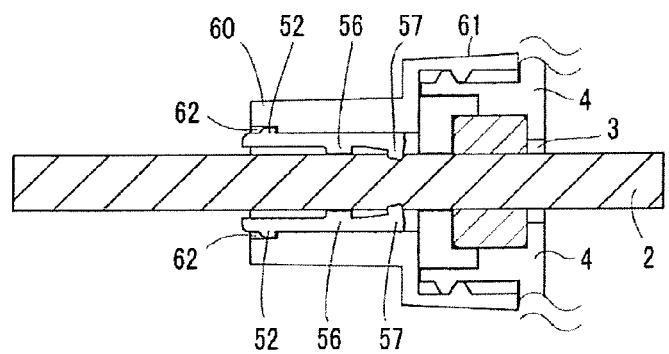
FIG. 5C is an explanatory diagram view illustrating a state after the installation of a cap member during assembly of the cable bushing in FIG. 1.

At this point, starting from before the installation of the cap member 6 as illustrated in FIG. 5(*a*), if the cap member 6 is tightened onto the base member 4 as illustrated in FIG. 5(*b*), the inner circumferential surface of the cap body 60 contacts the outer circumferential surface of the cable slippage stopper 57, and the cable slippage stopper 57 receiving cantilevered support from the support section 56 moves towards the inner circumferential surface side to bite and hold the cable 2. Note that at this point, the engaging section 52 is in a state of being pressed against the inner circumferential surface of the cap body 60.

Furthermore, if the cap member 6 is tightened onto the base member 4 as illustrated in FIG. 5(*c*), the engaging section 52 engages with the engaging receiver 62. At this point, the engaging section 52 moves towards the outer circumferential surface side as though released from the inner circumferential surface of the cap body 60. Thus, the support section 56 becomes seesaw, such that when the engaging section 52 engages with the engaging receiver 62, the cable slippage stopper 57 on the opposite side with the support section 56 in the center moves farther towards the inner circumferential surface side to hold the cable more strongly, making it possible to prevent slippage of the cable 2 during the process of installing the cap member 6. According to the cable bushing of the present embodiment as described in detail above, it is possible to reliably prevent slip-off while making assembly easy.

Note that in a cable bushing according to the present embodiment, there is described the case of forming the cutout 43 on the base member 4 while also forming the raised section 53 on the cable holding member 5 as turning regulation members. However, turning regulation members may also be formed by providing depressed or raised sections on either one of the base member 4 and the cable holding member 5.

Also, in a cable bushing according to the present embodiment, although the base ridge 44 of the base member 4 and the cap ridge 64 of the cap member 6 have a threading start position that is at the cutout 43 of the base member 4, and a threading end position that is a position rotated 90 degrees, the ridges are not limited thereto, and may be threaded at arbitrary positions. Furthermore, it may also be configured such that the engaging sections 52, 52 engage with the engaging receivers 62, 62 at a fixed angle other than 90 degrees.

In this case, it is desirable to indicate, with the raised section 53 of the cable holding member 5, for example, the rotation start position of a minimum rotational angle for engaging the engaging sections 52, 52 with the engaging receivers 62, 62. Thus, the worker is able to make the engaging sections engage with the engaging receivers by relying on the rotation start position and from that position turning the cap member by a fixed angle such that the engaging sections 52, 52 engage with the engaging receivers 62, 62. Furthermore, in the present embodiment, there is described the case where the rotational pushing-in mechanism is made up of helical base ridge 44 on the base member 4 and helical cap ridge 64 on the cap member 6. However, the rotational pushing-in mechanism is not limited thereto, and either one of the base ridge 44 and the cap ridge 64 may also be raised sections given as simple projections. A male screw groove and a female screw groove may also be used instead of the base ridge 44 and the cap ridge 64.

In addition, in the present embodiment, although there is described the case where the seal member 7 is a flexible plastic material such as urethane, the seal member 7 is not limited thereto, and may also be a filling material or other material. Furthermore, in the present embodiment, although the case of providing a seal member 7 is described, the seal member 7 may also be omitted in cases of indoor installation, for example.

REFERENCE SIGNS LIST

1: housing
2: cable
3: insertion hole
4: base member
5: cable holding member
5A, 5B: divided member
6: cap member
7: seal member
40: small-bore section
41: large-bore section
43: cutout
44: base ridge (rotational pushing-in mechanism)
50: holding member body
51: interlocking section
52: engaging section
53: raised section (first indicator)
56: support section
57: cable slippage stopper
60: cap body
61: large-bore cap section
62: engaging receiver
64: cap ridge (rotational pushing-in mechanism)
71: slit

The invention claimed is:

1. A cable bushing enabling insertion of a cable, comprising:
a housing provided with an insertion hole through which the cable is inserted;
a tubular base member projecting from an outer wall of the housing, concentrically with the insertion hole;
a cable holding member having a tubular shape that contacts and holds the cable at its inner circumferential surface, and also having, on its outer circumferential surface at a back end thereof, an interlocking section that interlocks with an inner circumferential surface of the base member; and
a cap member installed so as to cover an outer circumferential surface of the base member and the cable holding member while in a state where the interlocking section of the cable holding member is interlocked with the inner circumferential surface of the base member;
wherein a turning regulator is formed to one or both of the base member and the interlocking section so as to regulate the turning of the base member and the interlocking section of the cable holding member,
a rotational pushing-in mechanism is formed between the outer circumferential surface of the base member and the inner circumferential surface of the back end of the cap member, and
at least one engaging section is formed on the cable holding member, while in addition, at least one engaging receiver is formed with the cap member for being engaged by the at least one engaging section in a turning direction and an axial direction of the cap member.

2. The cable bushing according to claim 1, wherein
a first indicator indicating a rotation reference position is formed on the outer circumferential surface of the interlocking section of the cable holding member and is part of the turning regulator,
a second indicator indicating a rotation reference position is formed on the outer circumferential surface of the cap member, and
the engaging receiver is formed at a position which is engaged by the engaging section by mating the second indicator with the first indicator and turning the cap member by a fixed angle with respect to the cable holding member.

3. The cable bushing according to claim 1, wherein
a cutout is formed on the base member, and a raised section which interlocks with the cutout and which acts as a first indicator is formed on the outer circumferential surface of the interlocking section of the cable holding member, with the cutout and the raised section jointly defining the turning regulator, and
the fixed angle is 90 degrees, and the rotational pushing-in mechanism is formed over a span of at least 90 degrees in a rotational direction starting from the cutout on either one or both of the outer circumferential surface of the base member and the inner circumferential surface of the back end of the cap member.

4. The cable bushing according to claim 1, wherein
the cable holding member is equipped with a support section giving cantilevered support to the engaging section, and a cable slippage stopper given cantilevered support in the opposite direction of the engaging section from the support section and which projects to an inner circumferential surface side.

5. The cable bushing according to claim 1, wherein the cable holding member is symmetrically bisected left and right about a dividing line in a lengthwise direction.

6. The cable bushing according to claim 1, wherein in the cable holding member, the outer circumferential surface of the interlocking section has a larger bore at the front end thereof, and a seal member is installed at an inner circumferential surface of the interlocking section.

* * * * *